United States Patent [19]
Fallica

[11] Patent Number: 5,723,349
[45] Date of Patent: Mar. 3, 1998

[54] PROCESS FOR MANUFACTURING A HIGH CONDUCTIVITY INSULATED GATE BIPOLAR TRANSISTOR INTEGRATER STRUCTURE

[75] Inventor: Piero Giorgio Fallica, Catania, Italy

[73] Assignee: Consorzio pre la Ricerca sulla Microelettronica nel Mezzogiorno, Catania, Italy

[21] Appl. No.: 475,070

[22] Filed: Jun. 7, 1995

Related U.S. Application Data

[62] Division of Ser. No. 378,665, Jan. 26, 1995, abandoned.

[30] Foreign Application Priority Data

Jan. 27, 1994 [EP] European Pat. Off. ............ 94830028

[51] Int. Cl.⁶ ............................................. H01L 21/265
[52] U.S. Cl. ...................... 437/31; 437/40; 437/6; 437/154
[58] Field of Search .................. 437/31, 40, 6, 437/154

[56] References Cited

U.S. PATENT DOCUMENTS

| | | | |
|---|---|---|---|
| 4,047,220 | 9/1977 | Ferro et al. | 357/48 |
| 4,072,975 | 2/1978 | Ishitani | 357/23 |
| 4,233,615 | 11/1980 | Takemoto et al. | 357/22 |
| 4,305,974 | 12/1981 | Abe et al. | 427/89 |
| 4,376,286 | 3/1983 | Lidow et al. | 357/23 |
| 4,588,960 | 5/1986 | Salama et al. | 330/264 |
| 5,200,632 | 4/1993 | Sakurai | 257/212 |
| 5,264,378 | 11/1993 | Sakurai | 437/31 |
| 5,270,230 | 12/1993 | Sakurai | 437/40 |

FOREIGN PATENT DOCUMENTS

| | | | |
|---|---|---|---|
| 1 123 119 | 5/1982 | Canada | H01L 29/04 |
| 1 136 291 | 11/1982 | Canada | H01L 29/94 |
| 0503605 | 9/1992 | European Pat. Off. | H01L 29/72 |
| 0565350 | 10/1993 | European Pat. Off. | |
| 4112905 | 10/1991 | Germany | H01L 27/78 |
| 47-21739 | 6/1972 | Japan | |
| 0090561 | 4/1989 | Japan | |
| 0282872 | 11/1989 | Japan | |

OTHER PUBLICATIONS

IEEE, Ind. Appt. Soc. Annu. Meeting, 1980, pp. 682–688, P.L. Hower, "A Comparison of Bipolar And Field–Effect Transistors as Power Switches".

International Electron Devices Meeting, Tech. Digest, Dec. 8–10, 1980, Washington D.C., pp. 787–790 W. Donnison, et al., "Subsurface Junction Field Effect Transistor (SJET)".

The Theory of Practice of Microelectronics, Chapters 4, 6, 7, 8, 10, 13, and 15, Ghandi.

Physics and Technology of Semiconductor Devices, A.S. Grove, Intel Coporation, Mountain View, University of California, Berkeley, Chapters 3, 4, 6, 8, 9, 10 and 11.

European Search Report from European Patent Application No. 94830028.0, filed Jan. 27, 1994.

Patent Abstracts of Japan, vol. 11, No. 55 (E–481) (2502) 20 Feb. 1987 & JP–A–61 216 363 (Toshiba Corp.) 26 Sep. 1986.

*Primary Examiner*—Tuan H. Nguyen
*Attorney, Agent, or Firm*—Wolf, Greenfield & Sacks, P.C.; James H. Morris

[57] ABSTRACT

A high conductivity IGBT integrated structure comprises a heavily doped semiconductor substrate of a first conductivity type constituting a first electrode of the IGBT, a lightly doped semiconductor layer of a second conductivity type superimposed over the substrate, at least one first doped region of the first conductivity type extending from a top surface of the lightly doped layer thereinto and constituting a channel region of the IGBT, and a second doped region of the second conductivity type extending from said top surface into the first doped region and constituting a second electrode of the IGBT. A buried layer of semiconductor material is sandwiched between the substrate and the lightly doped layer and is constituted by heavily doped regions of the second conductivity type intercalated with lightly doped regions of the second conductivity type.

4 Claims, 2 Drawing Sheets

PROCESS FOR MANUFACTURING A HIGH CONDUCTIVITY INSULATED GATE BIPOLAR TRANSISTOR INTEGRATER STRUCTURE

This application is a division of application Ser. No. 08/378,665 filed Jan. 26, 1995 entitled HIGH CONDUCTIVITY INSULATED GATE BIPOLAR TRANSISTOR INTEGRATED STRUCTURE AND MANUFACTURING PROCESS THEREFOR, now abandoned.

BACKGROUND OF THE INVENTION

1. Field of the Invention

The present invention relates to a high conductivity insulated gate bipolar transistor integrated structure and to a manufacturing process therefor.

2. Discussion of the Related Art

MOS power devices suffer from the limitation of a rather high resistance introduced by the epitaxial drain region. In Insulated Gate Bipolar Transistors (IGBTs), such limitation is overcome by modulating the conductivity of the drain region, by injecting into the drain region minority carriers coming from a semiconductor substrate of opposite polarity in series with the drain region itself (and constituting, together with the drain region, a PN junction). The structure thus obtained is a four layer device: it comprises in fact a heavily doped substrate, for example of the P conductivity type; an epitaxial drain region, of the N conductivity type, grown over the P type substrate; a P type body region diffused into the N type drain region; and a heavily doped N type source region diffused into the P type body region.

A parasitic thyristor is inherently associated with the IGBT, and can be thought of as being composed by two parasitic bipolar transistors: a first NPN transistor having an emitter, a base and a collector respectively represented by the N type source region, the P type body region and the N type drain region of the IGBT; and second PNP transistor with an emitter, a base and a collector respectively represented by P type substrate, N type drain region and P-type body region.

In order to lower a probability of triggering on the parasitic thyristor, it is known to provide a thin heavily doped epitaxial layer of the same conductivity type as the drain region (called a "buffer layer" or a "field stopper") between the substrate and the drain region of the IGBT. The thin heavily doped epitaxial layer is also provided for reducing the minority carrier lifetime in the epitaxial drain region (introducing lifetime killers such as gold or platinum into the wafer, or irradiating the device with high energy electrons). Both the techniques allow a reduction in the gain of the second PNP parasitic transistor.

With regard to the lifetime killers, on one hand their presence reduces a switching time of the IGBT because as the IGBT is switched off, the minority carriers injected into the drain region cannot be extracted therefrom, since the drain region is not connected to any external terminal, and it is therefore necessary for the minority carriers to recombine as fast as possible, so that switching times comparable with those of bipolar power transistors can be achieved. On the other hand, the lifetime killers limit the drain region conductivity modulation, and thus the IGBT current handling capacity.

The buffer layer also works as a field stopper, limiting a width of the depletion region inside the drain region of the IGBT and thus preventing punchthrough between the body region and the substrate. In addition, the buffer layer increases the IGBT breakdown voltage, given the epitaxial drain thickness. However, since the buffer layer is heavily doped, the injection of minority carriers into the drain region of the IGBT is limited, and the conductivity modulation is therefore reduced.

It is therefore an object of the present invention to realize a high conductivity IGBT integrated structure wherein punchthrough between the body region and the substrate is prevented, but without excessively limiting the conductivity modulation of the epitaxial drain region.

SUMMARY OF THE INVENTION

According to the present invention, such object is attained by providing a high conductivity IGBT integrated structure comprising a heavily doped semiconductor substrate of a first conductivity type which constitutes a first electrode of the IGBT. In addition, the IGBT has a lightly doped semiconductor layer of a second conductivity type superimposed over the substrate, at least one first doped region of the first conductivity type extending from a top surface of the lightly doped layer into the lightly doped layer and a second doped region of the second conductivity type extending from said top surface into the first doped region. The IGBT further includes a buried layer of semiconductor material sandwiched between the substrate and the lightly doped layer which includes heavily doped regions of the second conductivity type intercalated with lightly doped regions of the second conductivity type.

The heavily doped regions of the buried layer of semiconductor material constitute altogether a discontinuous buffer layer which acts to prevent punchthrough of a depletion region, formed between the first doped region and the lightly doped layer, from occurring even when the IGBT is in breakdown condition. The lightly doped regions, intercalated with the heavily doped regions, provide a significant injection of minority carriers into the drain region of the IGBT, thus allowing an effective conductivity modulation to take place and thus increasing the current handling capability of the IGBT.

BRIEF DESCRIPTION OF THE DRAWINGS

The features of the present invention will be made more evident by the following detailed description of a particular embodiment, described as a non-limiting example in the annexed drawings, wherein.

DETAILED DESCRIPTION

Figure 1:
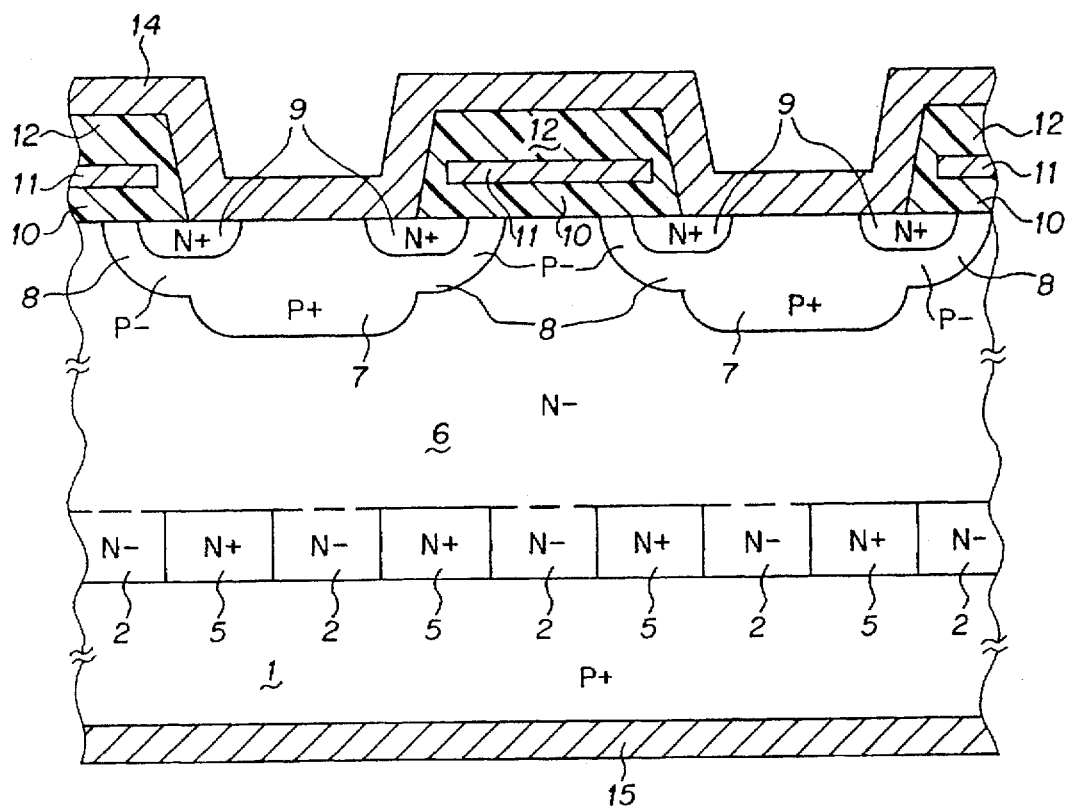
FIG. 1 is a cross-sectional view of a high conductivity insulated gate bipolar transistor integrated structure according to the present invention.

As shown in FIG. 1, an Insulated Gate Bipolar Transistor (IGBT) integrated structure, according to the present invention, comprises a heavily doped P+ semiconductor substrate 1 and a lightly doped Nlayer 6, which is generally epitaxially grown. However, it is to be appreciated that other procedures for growing an epitaxial layer, known to those skilled in the art, are contemplated by the present invention.

As known to anyone skilled in the art, a plurality of elementary IGBT cells are obtained in an IGBT chip, each cell contributing by a respective fraction to the overall device current. In FIG. 1, two such elementary cells are shown. Each elementary cell comprises substantially a heavily doped P+ region 7 (called a "body region") obtained by dopant diffusion into the Nlayer 6, a lightly doped Pannular region 8 laterally surrounding and merged with the P+ body region 7, and a heavily doped N+ annular region 9 obtained by dopant diffusion partially into the Pannular region 8 and partially into the P+ body region 7 A polysilicon layer 11, insulated from the underlying semiconductor regions 8 and 9 by means of a thin oxide layer 10, extends between adjacent elementary cells, so as to overlap the Pannular region 8 and, partially overlap, the N+ annular region 9. The polysilicon layer 11 is covered by an oxide layer 12, to allow electrical insulation between the polysilicon layer 11 and a metal layer 14 covering all the elementary cells. The metal layer 14 contacts the P+ body region 7 and an inner part of the N+ annular region 9 of all the elementary cells. A bottom surface of the P+ substrate 1 is covered by another metal layer 15.

From a functional point of view, the N+ annular region 9 is a source region for the IGBT elementary cell, the polysilicon layer 11 is an insulated gate layer, and the Nlayer 6 is a common drain region for all the elementary IGBT cells. When a proper bias voltage is applied to the gate layer 11, an N-type inversion layer or "channel" is formed at the surface of the Pannular region 8 under the gate layer 11. The Pannular region 8 represents therefore a channel region for the IGBT elementary cell. Electrons supplied by the metal layer 14, representing a source electrode for the IGBT, laterally flow from the source region 9 into the channel and drift vertically into the drain region 6. The electrons then recombine in the drain region 6 or in the substrate 1 giving rise, together with holes, to an IGBT collector current. When the IGBT on, then the drain/substrate junction is forward biased, and the metal layer 15 constitutes a collector electrode for the IGBT.

A heavily doped N+ buffer layer is generally provided between the P+ substrate 1 and the drain region 6. According to the present invention, between the P+ substrate 1 and the Ndrain region 6 there is provided a semiconductor layer composed by heavily doped N+ regions 5, intercalated with lightly doped Nregions 2. The Nregions 2 have a dopant concentration comparable to that of the N-drain layer 6, while the N+regions 5 altogether constitute a discontinuous buffer layer. The N+ regions 5, act as field stoppers to prevent punchthrough, by a depletion region, between the P+ body regions 7 and the P+ substrate 1. In addition, the Nregions 2, provide more minority carriers which are injected from the P+ substrate 1 into the Ndrain region 6. In contrast, if no Nregions 2 were provided, the number of minority carriers injected into the lightly doped region would be less. Since a higher number of minority carriers are injected into the drain region 6, according to the integrated structure of the present invention, an increased conductivity of the drain region 6 yields IGBTs with a higher current handling capacity.

It is to be appreciated that the ratio of N+ regions 5 with respect to the Nregions 2 can be varied to vary the number of minority carriers injected into the drain region 6, to achieve the desired conductivity modulation.

It is also to be appreciated that the above description is also valid in the case of P channel IGBTs, provided that all the N type semiconductor regions are substituted by P type regions and vice versa.

A manufacturing process suitable to fabricate an IGBT integrated structure, according to the invention, will be now described with reference to FIGS. 2 to 6.

Figure 2:
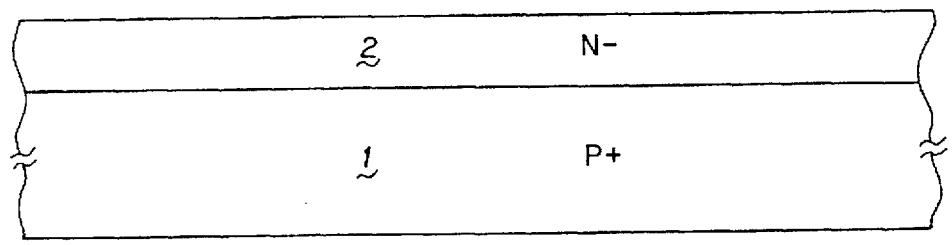
FIGS. 2 to 6 are cross-sectional views of the integrated structure of FIG. 1, illustrated at different steps of a manufacturing process of the insulated gate bipolar transistor integrated structure.

A semiconductor material wafer is heavily doped with dopants of a first conductivity type, either P or N, to form a heavily doped substrate 1. A lightly doped epitaxial layer 2 of a second, opposite conductivity type (respectively N or P) is grown thereover, as shown in FIG. 2. The epitaxial layer should have a dopant concentration as low as possible.

Figure 3:
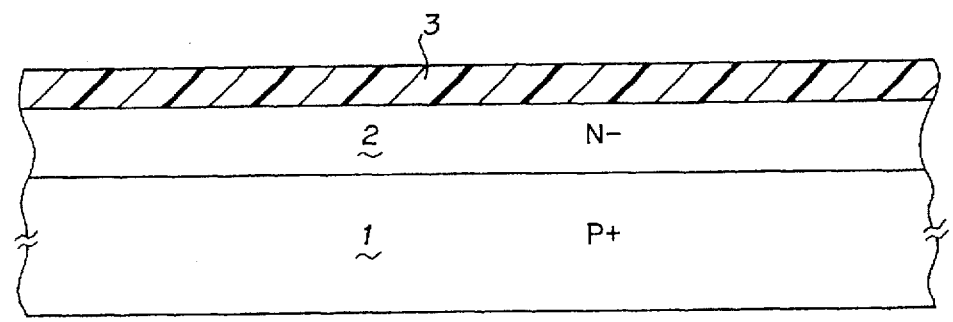
Figure 4:
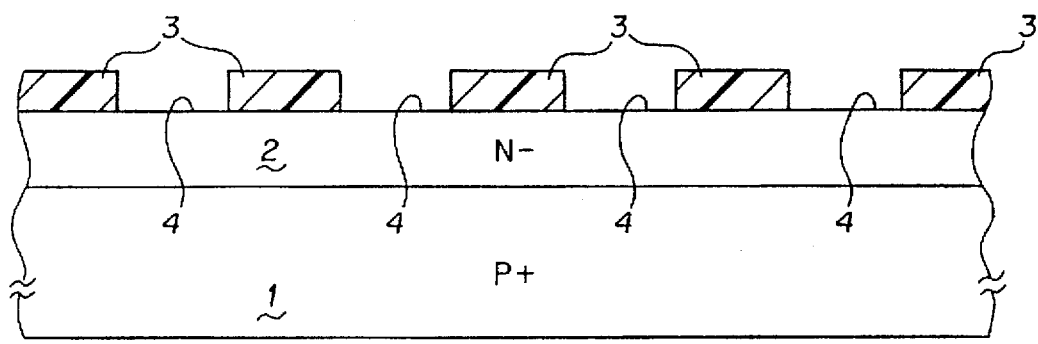

An oxide layer 3 is then grown over a top surface of the epitaxial layer 2, as illustrated in FIG. 3. The oxide layer is then selectively etched and removed to obtain uncovered surface portions 4 of the epitaxial layer 2, as illustrated in FIG. 4.

Figure 5:
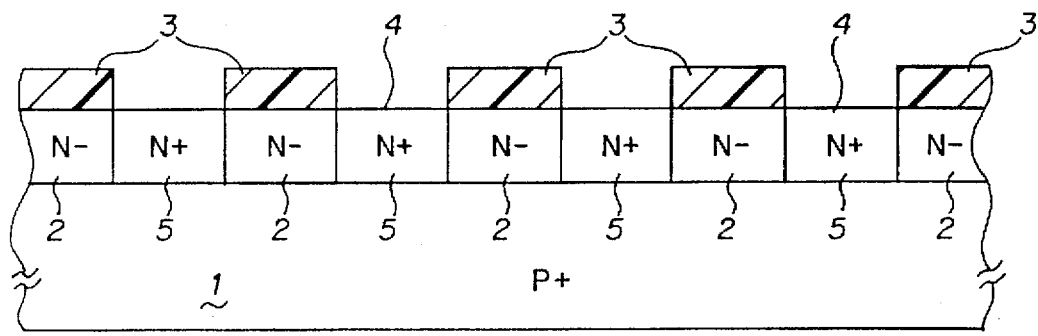

Dopant impurities, of the second conductivity type, are then selectively introduced into the epitaxial layer 2, through the windows in the oxide layer 3, to form heavily doped regions 5 of the second conductivity type under the uncovered surface portions 4 of the epitaxial layer 2, as illustrated in FIG. 5. It is to be appreciated that the dopant ions may be introduced by ion implantation or deposition, the oxide layer 3 acting as a mask, and by subsequent diffusion. It is to be further appreciated that other methods for introducing impurities into a semiconductor substrate, known to those skilled in the art, are contemplated by the present invention.

Figure 6:
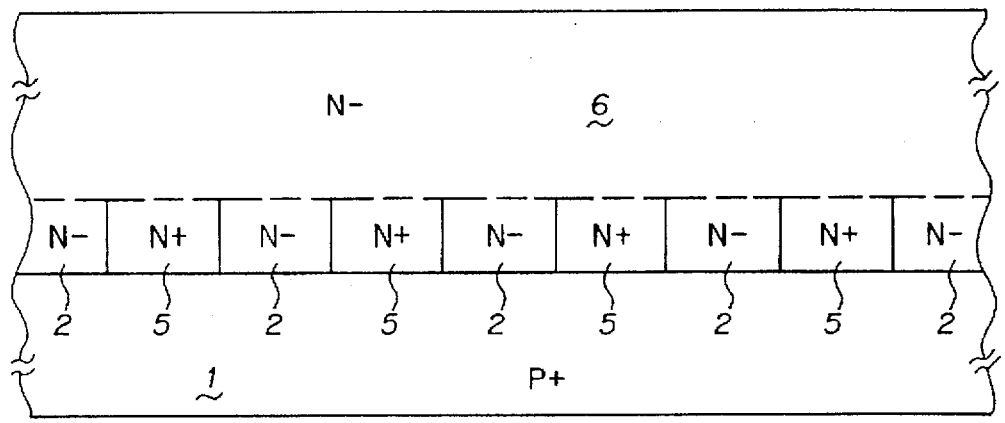

The oxide layer 3 is then removed from the entire surface of the epitaxial layer 2, and a thicker lightly doped epitaxial layer 6, also of the second conductivity type, is grown over the entire surface of the epitaxial layer 2, as illustrate in FIG. 6. After this step, a pattern of heavily doped regions 5 intercalated with lightly doped regions 2 is obtained between the heavily doped semiconductor substrate 1 and the lightly doped epitaxial layer 6.

The process is then similar to any known process suitable to fabricate IGBTs, or, in general, power MOS devices.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents, thereto.

What is claimed is:

1. A process for the manufacturing of an IGBT integrated structure, comprising the steps of:

a) growing a first epitaxial layer of a second conductivity type and a first dopant level over a substrate of a first conductivity type and a second dopant level;

b) growing an oxide layer over the first epitaxial layer;

c) selectively removing the oxide layer to obtain uncovered regions of the first epitaxial layer;

d) introducing a dose of the second dopant level of the second conductivity type into the uncovered regions of the first epitaxial layer to form regions of the second conductivity type and the second dopant level intercalated with regions of the second conductivity type and the first dopant level;

e) removing the oxide layer;

f) growing over the first epitaxial layer a second epitaxial layer of the second conductivity type and the first dopant level having a thickness greater than a thickness of the first epitaxial layer;

g) forming, in the second epitaxial layer, at least one first doped region of the first conductivity type; and h) forming, in said at least one first doped region, a respective second doped region of the second conductivity type wherein in step (d) a plurality of said regions of the second conductivity type and the second dopant level are formed below each of the at least one first doped regions of the first conductivity type formed in step (g).

2. The process according to claim 1, wherein the step of introducing the dose of the second dopant level into the uncovered regions is performed by ion implantation and diffusion.

3. The process according to claim 1, wherein the step of introducing the dose of the second dopant level into the uncovered regions is performed by deposition of the dopant impurities and by subsequent diffusion.

4. A process for the manufacturing of an IGBT integrated structure, comprising the steps of:

a) growing a first epitaxial layer of a second conductivity type and a first dopant level over a substrate of a first conductivity type and a second dopant level;

b) growing an oxide layer over the first epitaxial layer;

c) selectively removing the oxide layer to obtain uncovered regions of the first epitaxial layer;

d) introducing a dose of the second dopant level of the second conductivity type into the uncovered regions of the first epitaxial layer to form regions of the second conductivity type and the second dopant level intercalated with regions of the second conductivity type and the first dopant level such that a width of said regions of the second conductivity type and the second dopant level and a distance between two successive regions of the second conductivity type and the second dopant level are substantially the same as the thickness of the first epitaxial layer;

e) removing the oxide layer;

f) growing over the first epitaxial layer a second epitaxial layer of the second conductivity type and the first dopant level having a thickness greater than a thickness of the first epitaxial layer;

g) forming, in the second epitaxial layer, at least one first doped region of the first conductivity type; and h) forming, in said at least one first doped region, a respective second doped region of the second conductivity type.

* * * * *

UNITED STATES PATENT AND TRADEMARK OFFICE
CERTIFICATE OF CORRECTION

PATENT NO. : 5,723,349
DATED : March 3, 1998
INVENTOR(S): Piero Giorgio Fallica

It is certified that error appears in the above-identified patent and that said Letters Patent is hereby corrected as shown below:

On the title page, item [54] should read:

PROCESS FOR MANUFACTURING A HIGH CONDUCTIVITY INSULATED GATE BIPOLAR TRANSISTOR INTEGRATED STRUCTURE

On the title page, item [73] should read:

[73]  Assignee:  Consorzio per la Ricerca sulla Microelettronica nel Mezzogiorno, Catania, Italy Signed and Sealed this Second Day of June, 1998

Attest:

BRUCE LEHMAN

*Attesting Officer*   *Commissioner of Patents and Trademarks*